United States Patent
Wu et al.

(10) Patent No.: US 10,510,614 B2
(45) Date of Patent: *Dec. 17, 2019

(54) SEMICONDUCTOR ARRANGEMENT AND FORMATION THEREOF

(71) Applicant: Taiwan Semiconductor Manufacturing Company Limited, Hsin-Chu (TW)

(72) Inventors: I-Wen Wu, Hsinchu (TW); Hsien-Cheng Wang, Hsinchu (TW); Mei-Yun Wang, Chu-Pei (TW); Shih-Wen Liu, Taoyuan (TW); Chao-Hsun Wang, Chung-Li (TW); Yun Lee, XiZhi (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/396,966

(22) Filed: Apr. 29, 2019

(65) Prior Publication Data
US 2019/0252265 A1    Aug. 15, 2019

Related U.S. Application Data

(60) Continuation of application No. 16/166,238, filed on Oct. 22, 2018, now Pat. No. 10,276,448, which is a continuation of application No. 15/693,676, filed on Sep. 1, 2017, now Pat. No. 10,109,530, which is a continuation of application No. 15/362,746, filed on Nov. 28, 2016, now Pat. No. 9,754,838, which is a division of application No. 14/148,172, filed on Jan. 6, 2014, now Pat. No. 9,508,844.

(51) Int. Cl.
*H01L 21/8234* (2006.01)
*H01L 29/78* (2006.01)
*H01L 21/84* (2006.01)
*H01L 27/088* (2006.01)
*H01L 27/12* (2006.01)

(52) U.S. Cl.
CPC .......... *H01L 21/823475* (2013.01); *H01L 21/823431* (2013.01); *H01L 21/823481* (2013.01); *H01L 21/823487* (2013.01); *H01L 21/845* (2013.01); *H01L 27/0886* (2013.01); *H01L 27/1211* (2013.01); *H01L 29/78* (2013.01)

(58) Field of Classification Search
CPC combination set(s) only.
See application file for complete search history.

(56) References Cited

U.S. PATENT DOCUMENTS

2006/0226474 A1   10/2006   Ho et al.
2009/0002012 A1   1/2009    Doong et al.
2012/0319201 A1*  12/2012   Sun .................. H01L 21/823487
                                              257/338

* cited by examiner

*Primary Examiner* — Ratisha Mehta
(74) *Attorney, Agent, or Firm* — Cooper Legal Group, LLC (57) ABSTRACT

A semiconductor arrangement and method of forming the same are described. A semiconductor arrangement includes a third metal connect in contact with a first metal connect in a first active region and a second metal connect in a second active region, and over a shallow trench isolation region located between the first active region and a second active region. A method of forming the semiconductor arrangement includes forming a first opening over the first metal connect, the STI region, and the second metal connect, and forming the third metal connect in the first opening. Forming the third metal connect over the first metal connect and the second metal connect mitigates RC coupling.

20 Claims, 10 Drawing Sheets

SEMICONDUCTOR ARRANGEMENT AND FORMATION THEREOF

RELATED APPLICATION

This application is a continuation of and claims priority to U.S. patent application Ser. No. 16/166,238, titled "SEMICONDUCTOR ARRANGEMENT AND FORMATION THEREOF" and filed on Oct. 22, 2018, which is a continuation of and claims priority to U.S. patent application Ser. No. 15/693,676, now U.S. Pat. No. 10,109,530, titled "SEMICONDUCTOR ARRANGEMENT AND FORMATION THEREOF" and filed on Sep. 1, 2017, which is a continuation of and claims priority to U.S. patent application Ser. No. 15/362,746, now U.S. Pat. No. 9,754,838, titled "SEMICONDUCTOR ARRANGEMENT AND FORMATION THEREOF" and filed on Nov. 28, 2016, which is a divisional of and claims priority to U.S. patent application Ser. No. 14/148,172, now U.S. Pat. No. 9,508,844, titled "SEMICONDUCTOR ARRANGEMENT AND FORMATION THEREOF" and filed on Jan. 6, 2014. U.S. patent application Ser. Nos. 16/166,238, 15/693,676, 15/362,746 and 14/148,172 are incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments, a semiconductor arrangement comprises a first active region, a second active region and a shallow trench isolation (STI) region, the STI region between the first active region and the second active region. According to some embodiments, a first metal connect is over the first active region and connected to the first active region. According to some embodiments, a second metal connect is over a second active region and connected to the second active region. In some embodiments, a third metal connect is over the first metal connect, the STI region and the second metal connect, and connected to the first metal connect and the second metal connect such that the third metal connect connects the first metal connect to the second metal connect. In some embodiments, the first active region is one of a source or a drain. In some embodiments, the second active region is one of a source or a drain. In some embodiments, the third metal connect connects at least one of a source of the first active region to a source of the second active region, a drain of the first active region to a drain of the second active region, or a source of the first active region to a drain of the second active region. In some embodiments, the third metal connect mitigates resistance-capacitance (RC) coupling because a distance between the third metal connect and a gate associated with the semiconductor arrangement is greater than a distance between the gate and a different metal connect that would otherwise be used to connect the first active region to the second active region, such as a different metal connect that is not over the first metal connect, the STI region and the second metal connect. In some embodiments, a reduced or minimized RC coupling between the gate and a metal connect, such as the third metal connect, that connects the first active region to the second active region results in at least one of reduced resistance-capacitance (RC) delay or better performance, wherein better performance comprises at least one of improved speed or operative predictability.

According to some embodiments, forming a semiconductor arrangement comprises forming a first opening over a first active region, a shallow trench isolation (STI) region and a second active region, such that the first opening is over a first metal connect in the first active region and is over a second metal connect in the second active region. According to some embodiments, a third metal connect is formed in the first opening such that the third metal connect connects the first metal connect to the second metal connect. In some embodiments, as second opening is formed over a gate in the STI region. In some embodiments, a metal contact is formed in the second opening. In some embodiments, the first opening and the second opening are formed concurrently. In some embodiments, the first metal connect has a third height and the second metal connect has a fourth height, the third height substantially equal to the fourth height. In some embodiments, the gate has fifth height, the fifth height substantially equal to the third height. In some embodiments, the third metal connect, which is over the first metal connect and the second metal connect, has a first height.

Figure 1:
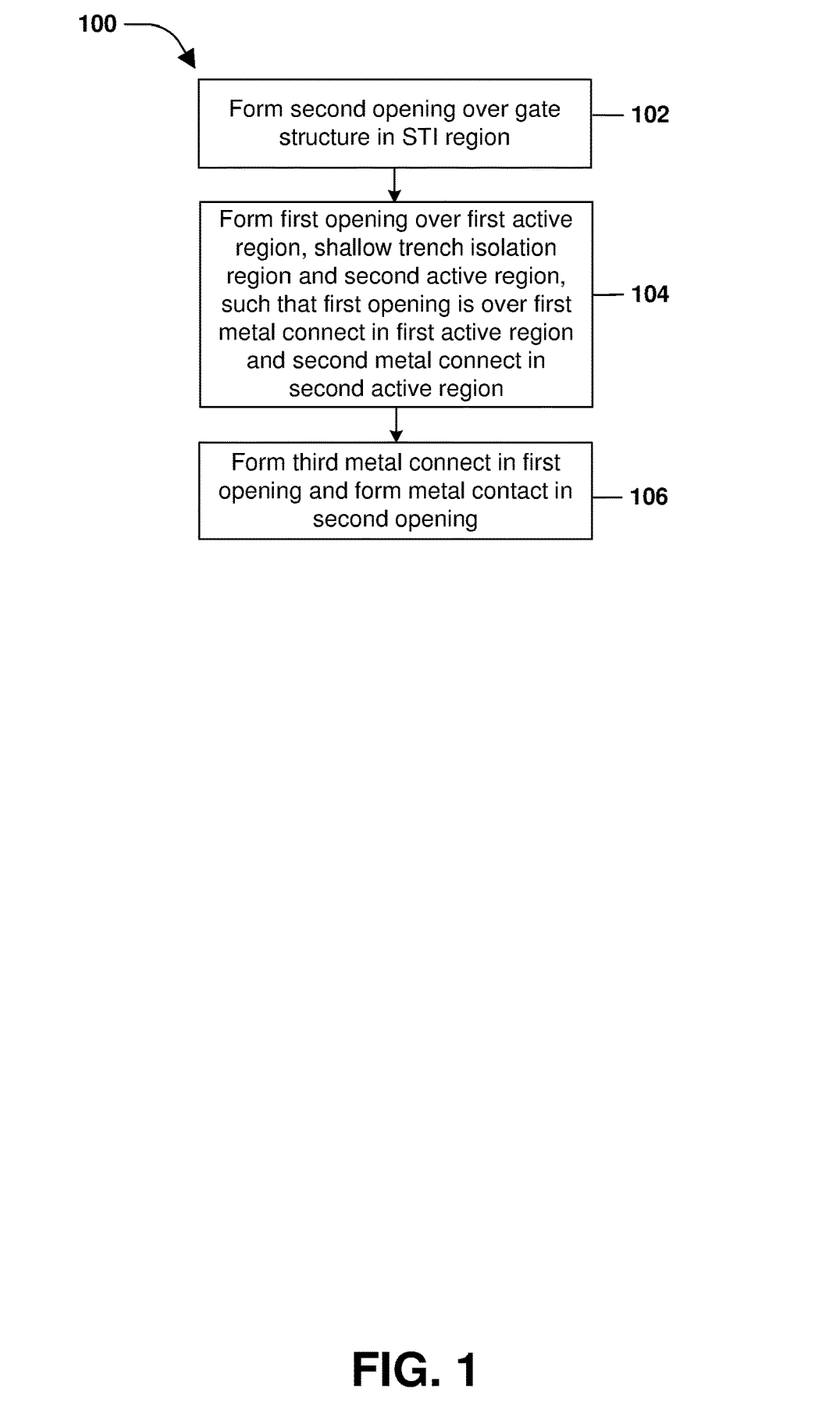
FIG. 1 is a flow diagram illustrating a method of forming a semiconductor arrangement, according to some embodiments.

A method 100 of forming a semiconductor arrangement 200 according to some embodiments is illustrated in FIG. 1 and one or more structures formed thereby at various stages of fabrication are illustrated in FIGS. 2-17. According to some embodiments, such as illustrated in FIG. 16, the semiconductor arrangement 200 comprises a first active region 205, a second active region 207 and a shallow trench isolation (STI) region 209, the STI region 209 between the first active region 205 and the second active region 207. According to some embodiments, a first metal connect 215 is over the first active region 205 and connected to the first active region 205. According to some embodiments, a second metal connect 216 is over the second active region 207 and connected to the second active region 207. In some embodiments, a third metal connect 218 is over the first metal connect 215, the STI region 209 and the second metal connect 216, and connected to the first metal connect 215 and the second metal connect 216, such that the third metal connect 218 connects the first metal connect 215 to the second metal connect 216 thereby connecting the first active region 205 to the second active region 207.

Figure 2:
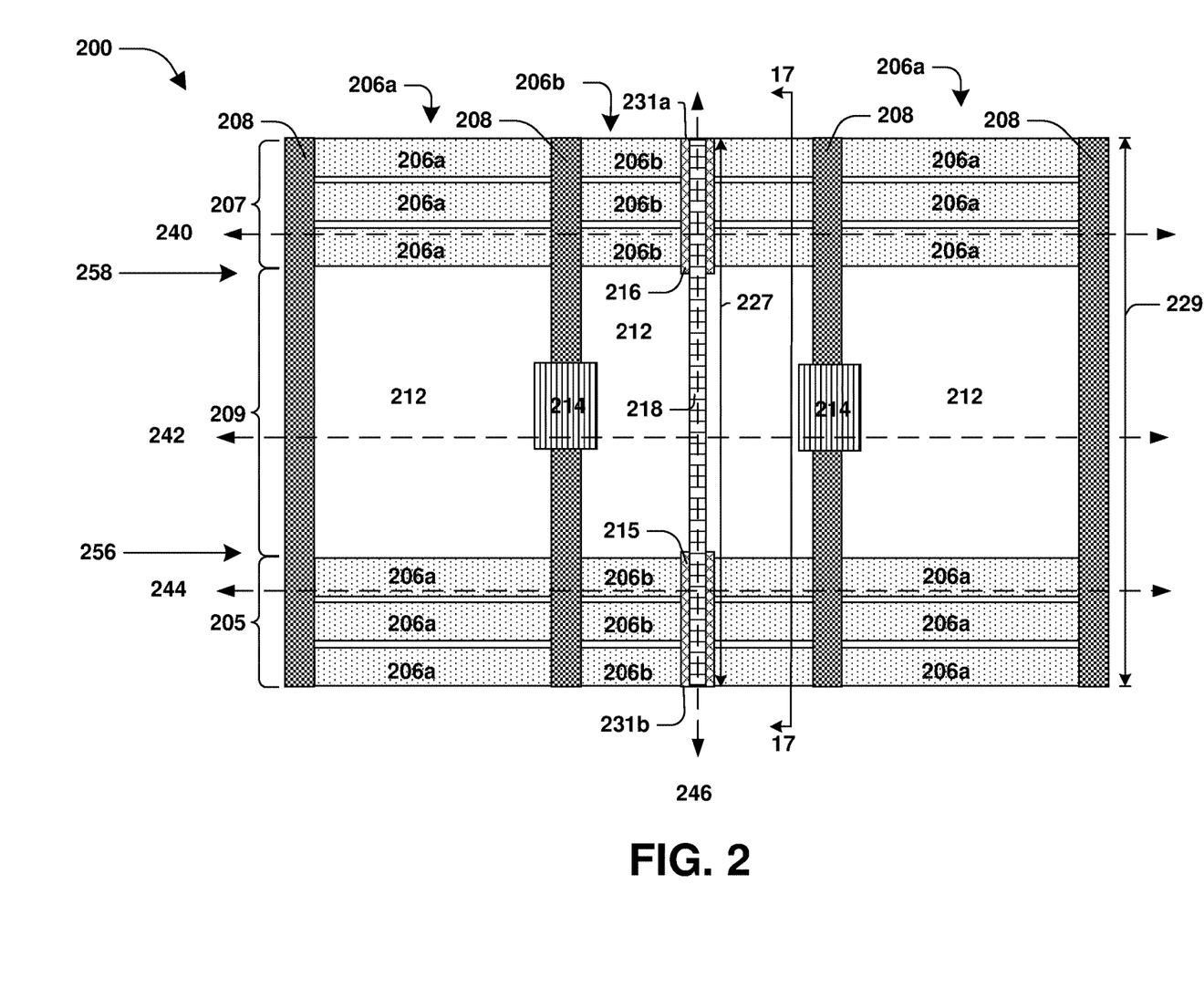
FIG. 2 is an illustration of a semiconductor arrangement, according to some embodiments.

Turning to FIG. 2 an overview or top down view of the semiconductor arrangement 200 is illustrated according to some embodiments, where a second dielectric layer 224 illustrated in FIGS. 3-15 is not shown in FIG. 2 so that features underlying the second dielectric layer 224 are visible in FIG. 2. In FIG. 2 four lines 240, 242, 244 and 246 are drawn to illustrate cross-sections that are depicted in other Figs. A first line 240 cuts through the second active region 207, multiple gates 208, the second metal connect 216 and the third metal connect 218, where the second active region 207 is a region where as at least one of a source or a drain are formed, according to some embodiments. FIG. 15 is a cross sectional view of the semiconductor arrangement 200 taken along the first line 240 at a latter stage of fabrication. A second line 242 cuts through the STI region 209, the multiple gates 208, multiple metal contacts 214 and the third metal connect 218, where the STI region 209 comprises STI 220. FIGS. 3, 5, 7, 9, 11 and 13 are cross sectional views of the semiconductor arrangement 200 taken along the second line 242 at various stages of fabrication. A third line 244 cuts through the first active region 205, the multiple gates 208, the first metal connect 215 and the third metal connect 218, where the first active region 205 is a region where as at least one of a source or a drain are formed, according to some embodiments. FIGS. 4, 6, 8, 10, 12 and 14 are cross sectional views of the semiconductor arrangement 200 taken along the third line 244 at various stages of fabrication. A fourth line 246, cuts through the first metal connect 215, the third metal connect 218 and the second metal connect 216, according to some embodiments, where the third metal connect 218 is formed to connect the first active region 205 to the second active region 207. FIG. 16 is a cross sectional view of the semiconductor arrangement 200 taken along the fourth line 246 at a latter stage of fabrication.

Figure 3:
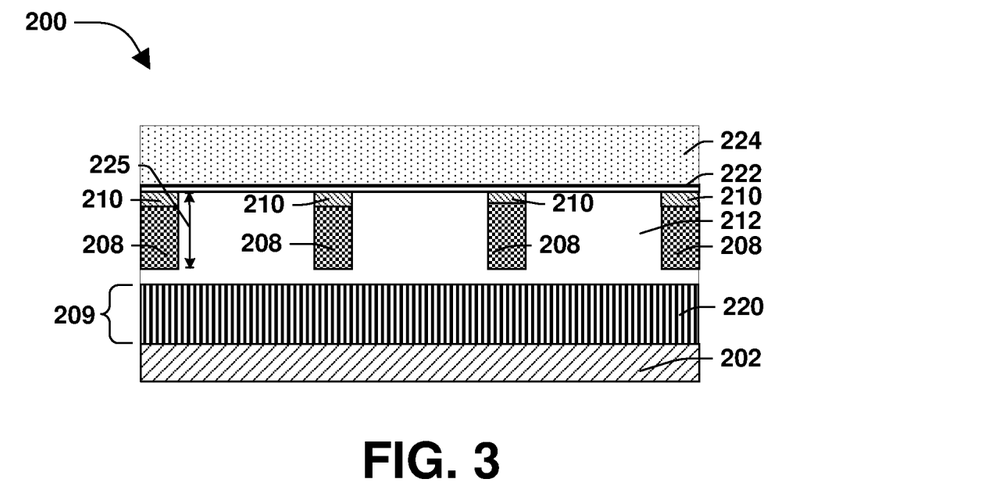
FIG. 3 is an illustration of a semiconductor arrangement, according to some embodiments.
Figure 4:
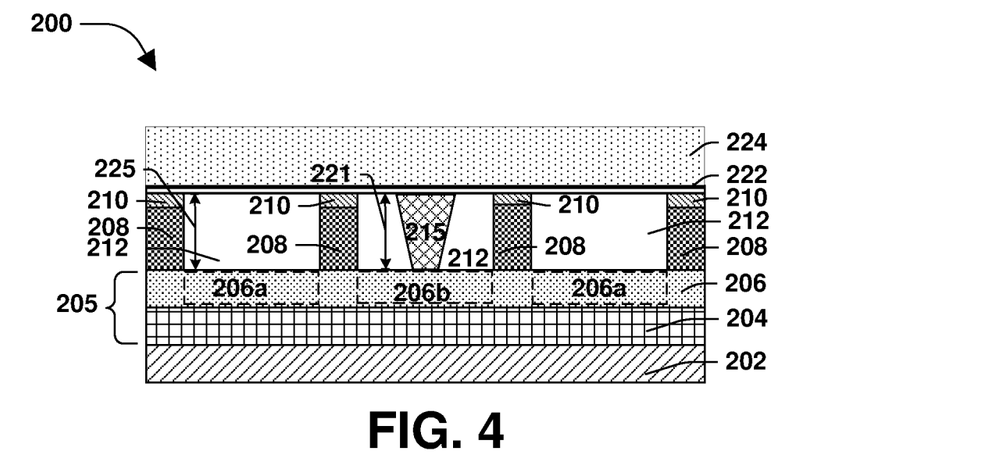
FIG. 4 is an illustration of a semiconductor arrangement, according to some embodiments.
Figure 5:
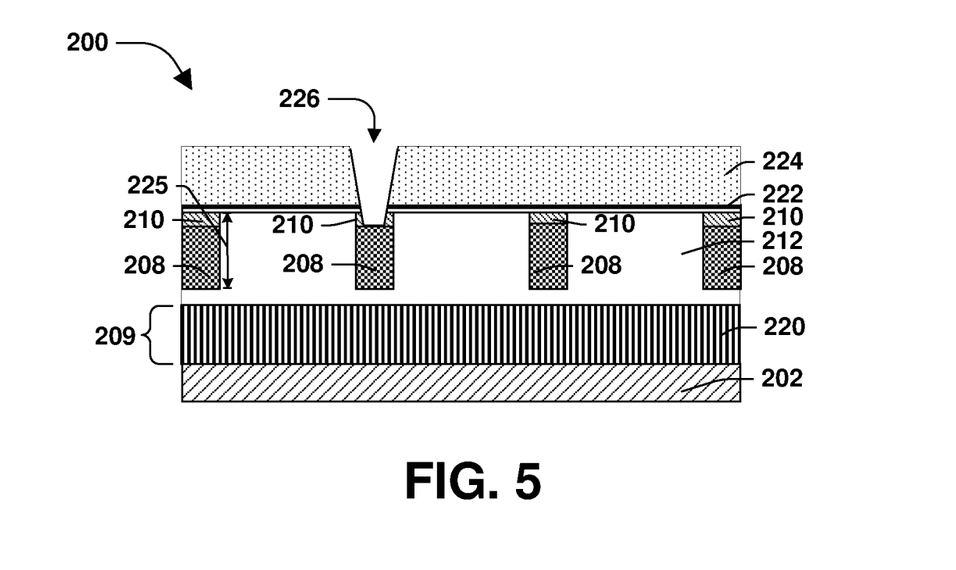
FIG. 5 is an illustration of a semiconductor arrangement, according to some embodiments.
Figure 6:
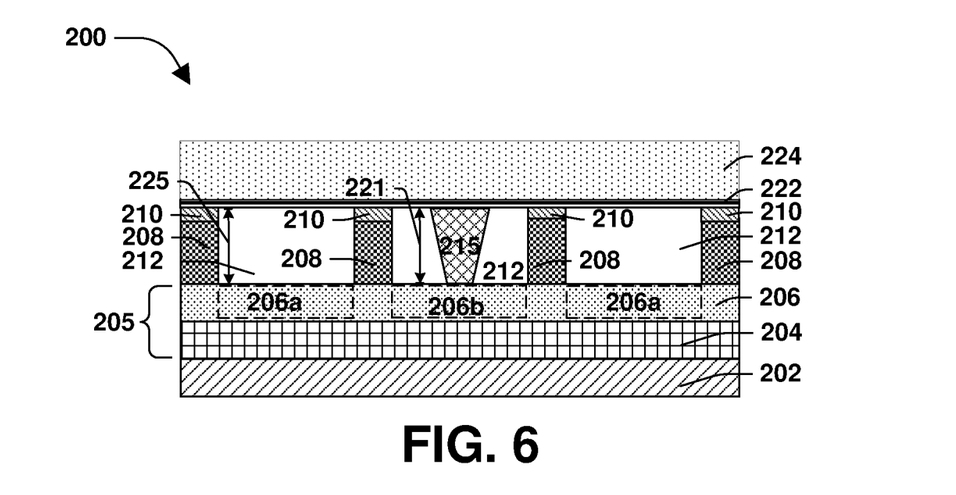
FIG. 6 is an illustration of a semiconductor arrangement, according to some embodiments.
Figure 17:
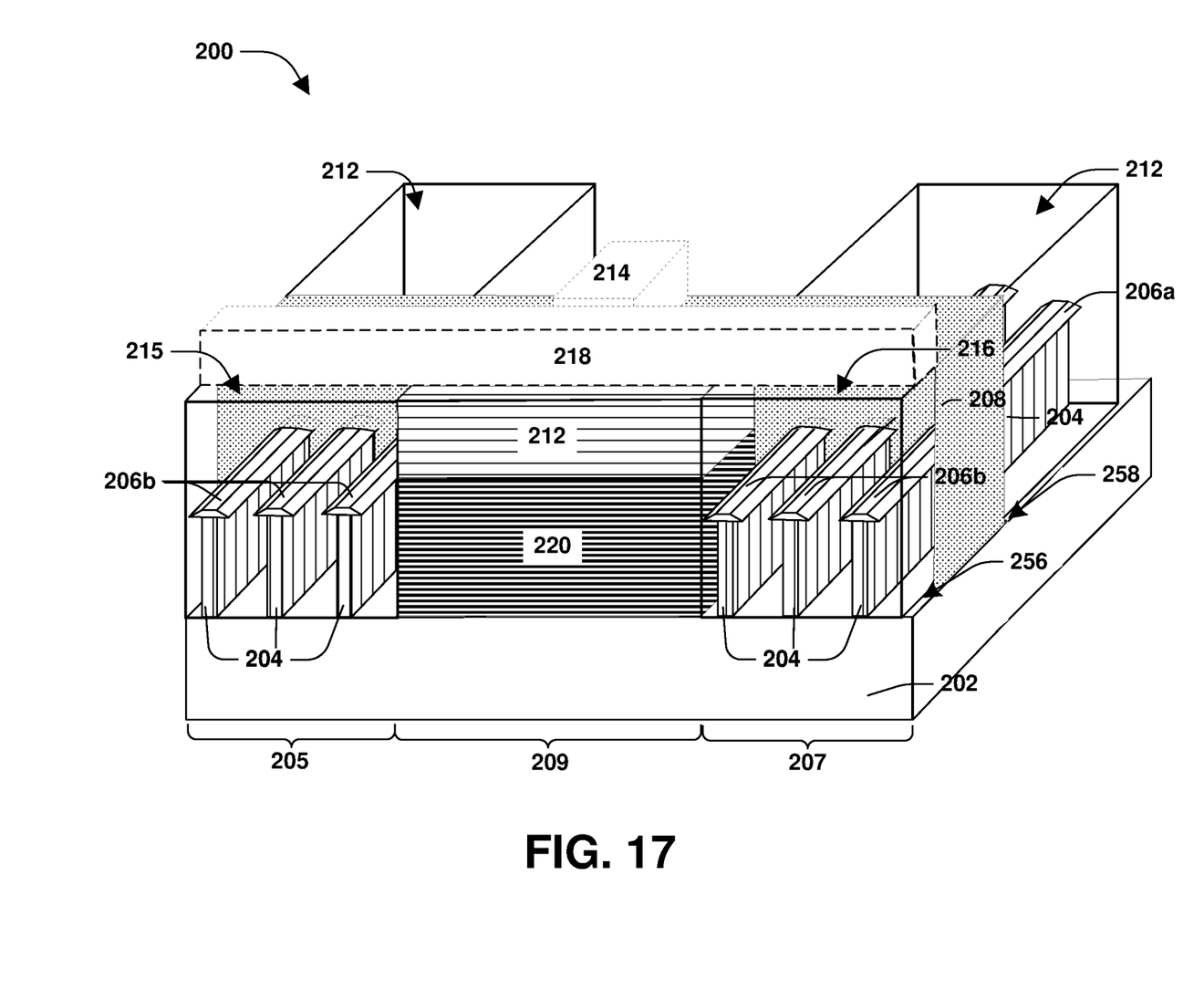
FIG. 17 is an illustration of a semiconductor arrangement, according to some embodiments.

At 102, a second opening 226 is formed over a gate 208 in the STI region 209, as illustrated in FIG. 5. Turning to FIG. 3, which illustrates a cross-section of the second line 242 of FIG. 2, where the second line 242 cuts through the STI region 209. The semiconductor arrangement 200 comprises a substrate 202. In some embodiments, the substrate 202 comprises at least one of silicon oxide or silicon nitride. According to some embodiments, the substrate 202 comprises at least one of an epitaxial layer, a silicon-on-insulator (SOI) structure, a wafer, or a die formed from a wafer. In some embodiments, an STI 220 is formed over the substrate 202 in the STI region 209. In some embodiments, the STI 220 comprises a dielectric material, such as silicon oxide (SiO$_2$). In some embodiments, the STI 220 formation comprises deposition of the dielectric material. In some embodiments, the STI region 209 comprises the STI 220. In some embodiments, the STI 220 has a thickness between about 20 nm to about 70 nm. Turning to FIG. 4, which illustrates a cross-section of the third line 244 of FIG. 2, where the third line 244 cuts through the first active region 205. In some embodiments, one or more fins 204 are formed in the substrate 202 of the first active region 205. In some embodiments, the one or more fins 204 comprise the same material as the substrate 202. In some embodiments, the one or more fins 204 have a height between 5 nm to about 45 nm. In some embodiments, an epitaxial (Epi) cap 206 is formed over the one or more fins 204. In some embodiments, the Epi cap 206 is grown. In some embodiments, the Epi cap 206 comprises at least one of silicon, nitride, or oxide. In some embodiments, the second active region 207 is formed substantially the same way as the first active region 205. In some embodiments, a first dielectric layer 212 is formed, such as by deposition, over the STI 220 and the Epi cap 206, as illustrated in FIGS. 3, 4 and 17. In some embodiments, the Epi cap 206a comprises at least one of a source or a drain. In some embodiments, the Epi cap 206b comprises a source if the Epi cap 206a comprises a drain, and the Epi cap 206b comprises a drain if the Epi cap 206a comprises a source. In some embodiments, the first dielectric layer 212 comprises a standard dielectric material with a medium or low dielectric constant, such as SiO$_2$. In some embodiments, the first dielectric layer 212 has thickness between about 20 nm to about 150 nm. In some embodiments, the gate 208, or a plurality of gates 208, as illustrated in FIGS. 3 and 4, are formed in the first dielectric layer 212, such that the gate 208 is in contact with the Epi cap 206 of the first active region 205 and the Epi cap 206 of the second active region 207 and over the STI region 209. In some embodiments, the gate 208 comprises a layer of high dielectric constant material in contact with the Epi cap 206 of the first active region 205 and the second active region 207, as illustrated in FIGS. 4 and 17. In some embodiments, the high dielectric constant material comprises at least one of nitride or oxide. In some embodiments, the gate 208 comprises a conductive material, such as metal, formed, such as by deposition, over the high dielectric constant material. In some embodiments, a hard mask 210 is formed, such as by deposition, over the gate 208. In some embodiments, the gate 208 has a fifth height 225 between about 20 nm to about 130 nm. In some embodiments, the hard mask 210 comprises oxide or nitride. In some embodiments, the first metal connect 215 is in contact with the Epi cap 206b in the first active region 205. In some embodiments, the Epi cap 206a is in contact with the first metal connect 215 (not shown). In some embodiments, the first metal connect 215 comprises a conductive material such as at least one of metal or polysilicon. In some embodiments, the first metal connect 215 formation comprises deposition. In some embodiments, the first metal connect 215 has a third height 221 between about 30 nm to about 130 nm, as illustrated in FIG. 4. In some embodiments, the second metal connect 216 has a fourth height 223, as illustrated in FIG. 15, substantially equal to the third height 221. In some embodiments, the fifth height 225 of the gate 208 is substantially equal to the third height 221. In some embodiments, an etch stop layer 222 is formed over the hard mask 210, the first dielectric layer 212 and the first metal connect 215, such as by deposition. In some embodiments, the etch stop layer 222 comprises at least one of silicon, nitride or oxide. In some embodiments, the second metal connect 216 is in contact with the Epi cap 206b in the second active region 207. In some embodiments, the second metal connect 216 is formed in substantially the same manner as the first metal connect 215. In some embodiments, a second dielectric layer 224 is formed over the etch stop layer 222. In some embodiments, the second dielectric layer 224 comprises a standard dielectric material with a medium or low dielectric constant, such as $SiO_2$. In some embodiments, the second dielectric layer 224 has thickness between about 20 nm to about 150 nm. Turning to FIG. 5, the second opening 226 is formed, such as by etching, in the second dielectric layer 224, the etch stop layer 222, and the hard mask 210, such that the second opening 226 exposes at least part of the gate 208.

Figure 7:
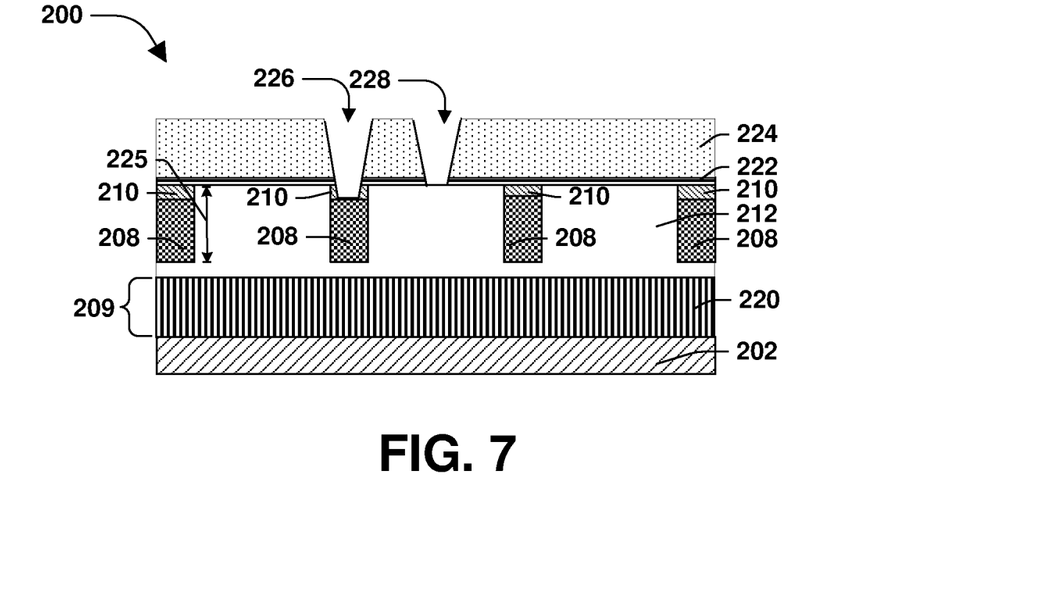
FIG. 7 is an illustration of a semiconductor arrangement, according to some embodiments.
Figure 8:
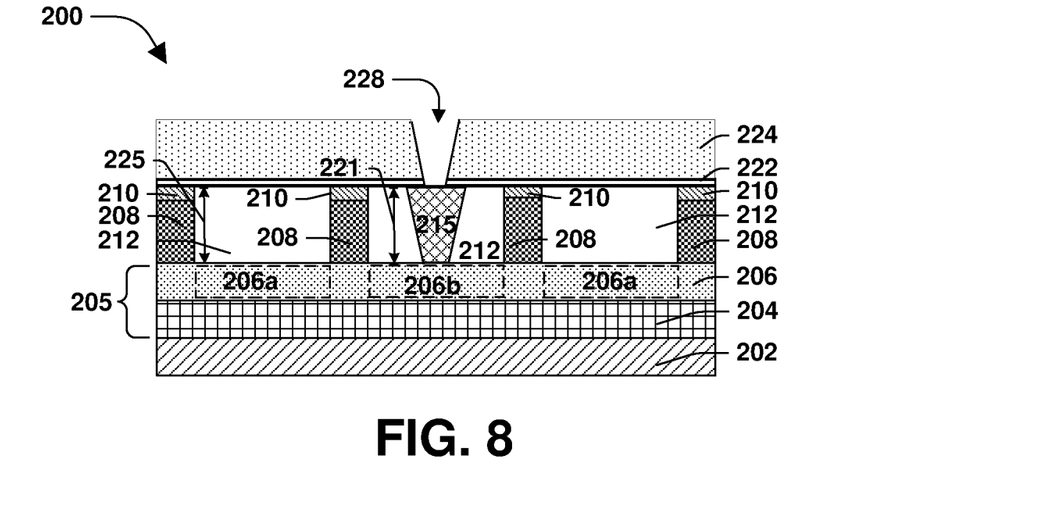
FIG. 8 is an illustration of a semiconductor arrangement, according to some embodiments.

At 104, a first opening 228 is formed over the first active region 205, the STI region 209 and the second active region 207, such that the first opening 228 is over the first metal connect 215 and the second metal connect 216, as illustrated in FIGS. 7 and 8. In some embodiments, the first opening 228 is formed, such as by etching, through the second dielectric layer 224 and the etch stop layer 222. In some embodiments, the first opening 228 is formed, such that in the first active region 205 and the second active region 207 the first opening 228 exposes at least a portion of the first metal connect 215 and at least a portion of the second metal connect 216. In some embodiments, the first opening 228 is formed such that in the STI region 209, the first opening 228 exposes at least part of the first dielectric layer 212.

Figure 9:
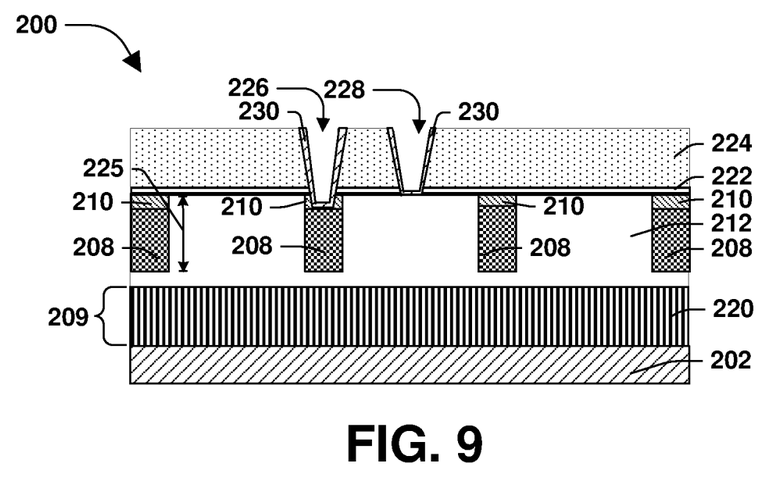
FIG. 9 is an illustration of a semiconductor arrangement, according to some embodiments.
Figure 10:
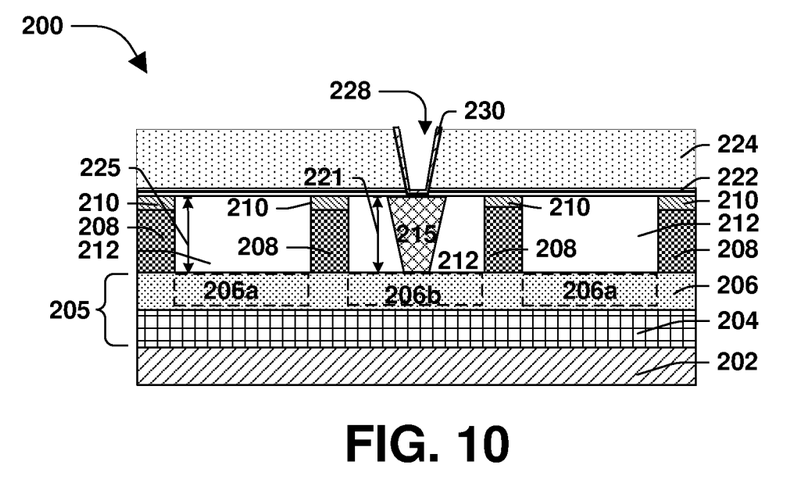
FIG. 10 is an illustration of a semiconductor arrangement, according to some embodiments.
Figure 11:
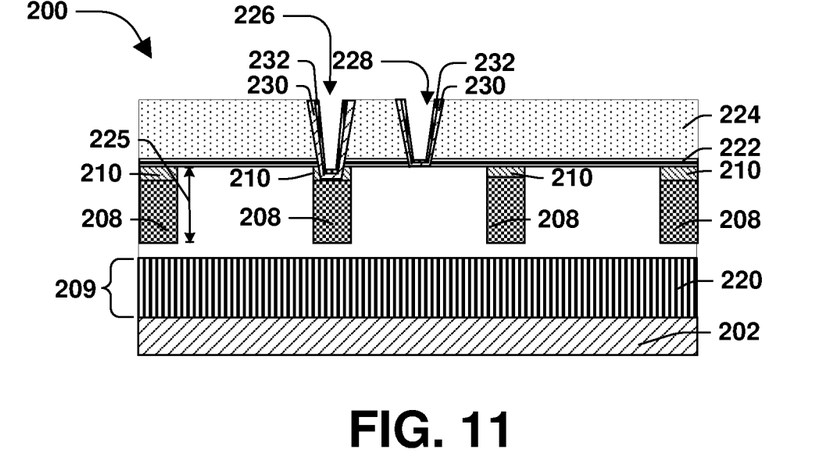
FIG. 11 is an illustration of a semiconductor arrangement, according to some embodiments.
Figure 12:
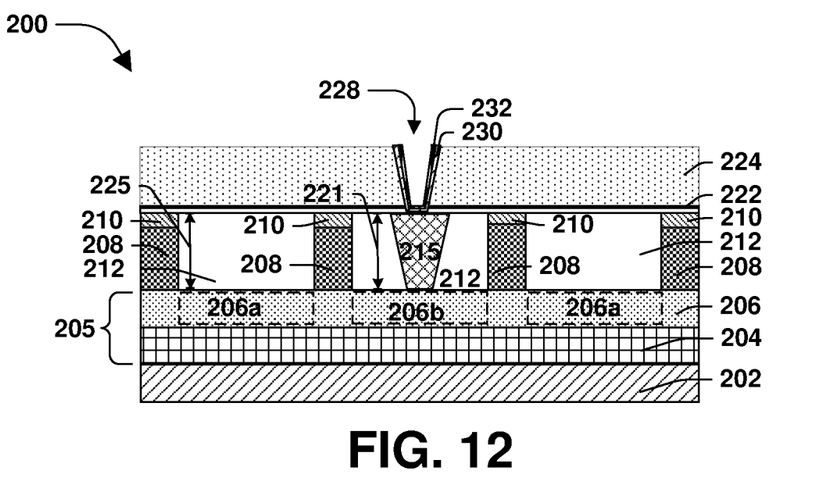
FIG. 12 is an illustration of a semiconductor arrangement, according to some embodiments.
Figure 13:
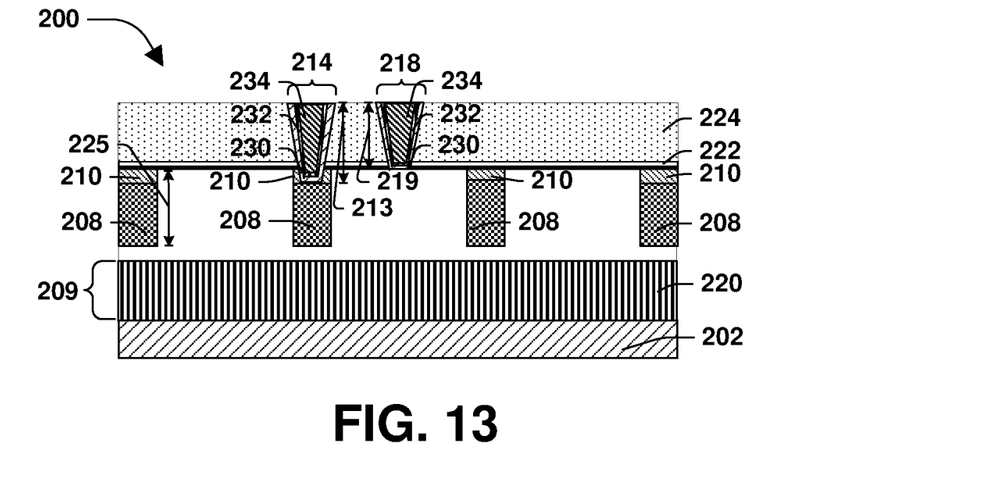
FIG. 13 is an illustration of a semiconductor arrangement, according to some embodiments.
Figure 14:
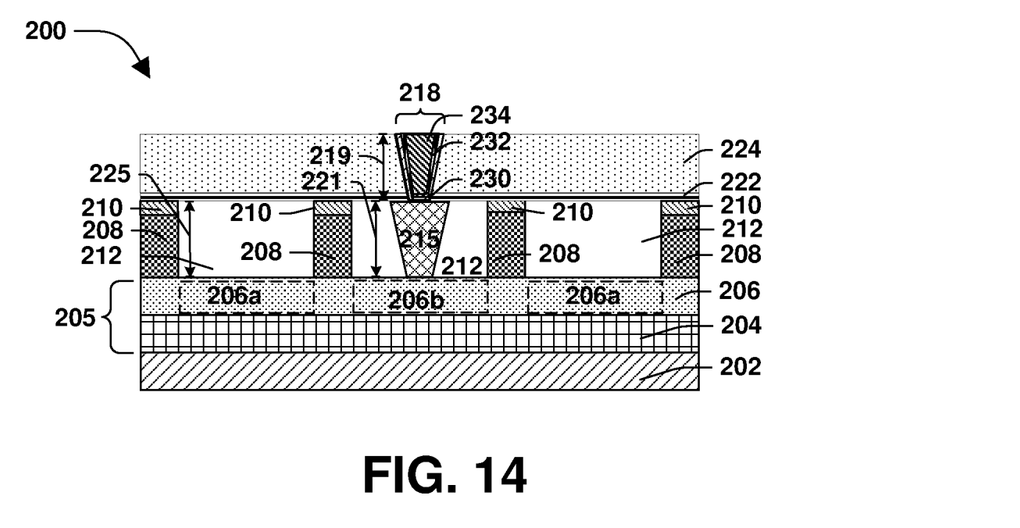
FIG. 14 is an illustration of a semiconductor arrangement, according to some embodiments.
Figure 15:
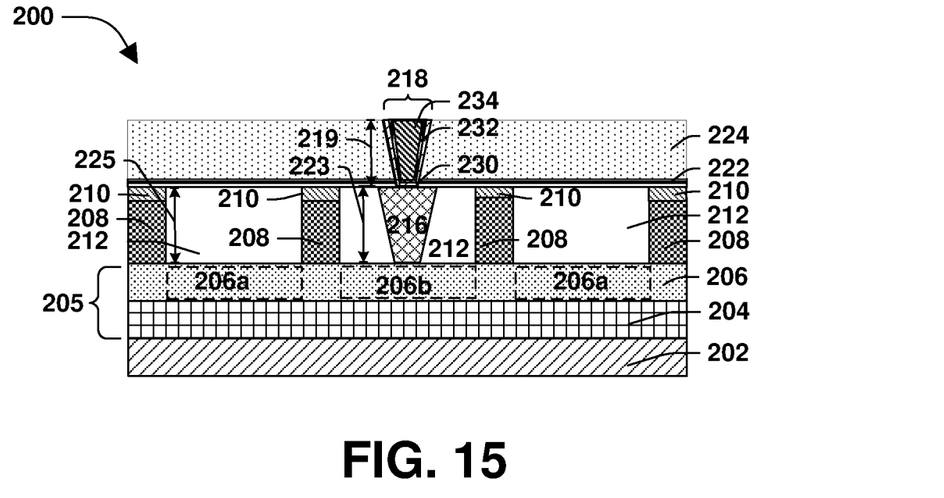
FIG. 15 is an illustration of a semiconductor arrangement, according to some embodiments.
Figure 16:
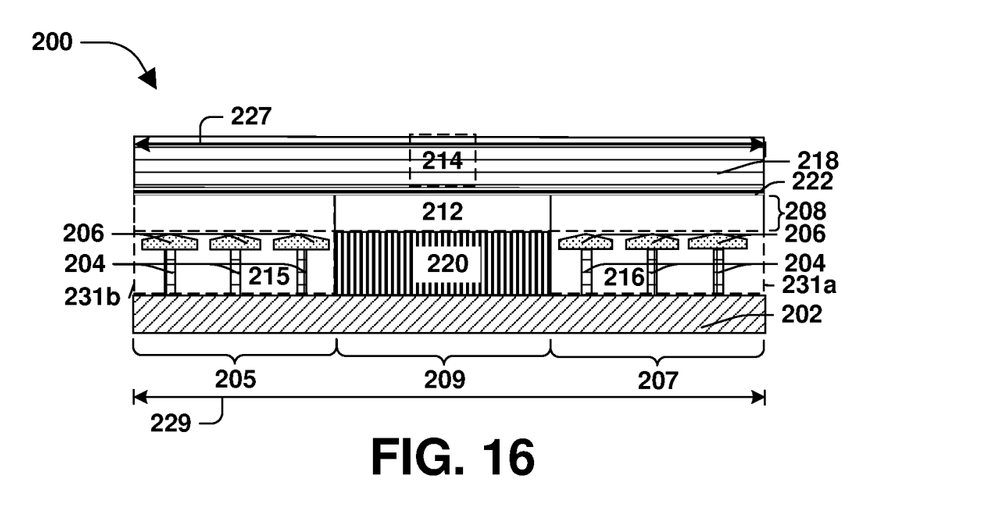
FIG. 16 is an illustration of a semiconductor arrangement, according to some embodiments.

At 106, the third metal connect 218 is formed in the first opening 228 and the metal contact 214 is formed into the second opening 226, as illustrated in FIGS. 13-15. Turning to FIG. 9, a first metal layer 230 is formed in the first opening 228 and the second opening 226. In some embodiments, the first metal layer 230 is formed by deposition. In some embodiments, the first metal layer 230 comprises titanium. In some embodiments, the first metal layer 230 has a thickness of 1 nm to about 10 nm. In some embodiments, the first metal layer 230 in the second opening 226 is in contact with the gate 208, as illustrated in FIG. 9. In some embodiments, the first metal layer 230 in the first opening 228 is in contact with the first metal connect 215 in the first active region 205, as illustrated in FIG. 10, and the second metal connect 216 in the second active region 207, as illustrated in FIG. 15. Turning to FIGS. 11-12, which illustrates a second metal layer 232 formed over the first metal layer 230 in the first opening 228 and over the first metal layer 230 in the second opening 226. In some embodiments, the second metal layer 232 is formed by deposition. In some embodiments, the second metal layer 232 comprises titanium nitride. In some embodiments, the second metal layer 232 has a thickness of 1 nm to about 10 nm. Turning to FIGS. 13-15, which illustrates the formation of a metal fill 234 in the first opening 228 to form the third metal connect 218 and the formation of the metal fill 234 in the second opening 226 over the second metal layer 232 to form the metal contact 214. In some embodiments, the metal fill 234 is formed by deposition. In some embodiments, the metal fill 234 comprises tungsten. In some embodiments, excess first metal layer 230, second metal layer 232 and metal fill 234 are removed, such as by chemical mechanical planarization (CMP). Turning to FIG. 16, which illustrates a cross-section of the fourth line 246 of FIG. 2, where the fourth line 246 cuts through the first metal connect 215, the second metal connect 216 and the third metal connect 218. In some embodiments, the third metal connect 218 has a third metal length 227, the third metal length 227 substantially equal to a semiconductor arrangement length 229. In some embodiments, the semiconductor arrangement length 229 is measured from a first distal sidewall 231b of the first metal connect 215 to a second distal sidewall 231a of the second metal connect 216.

Turning to FIG. 17, a 3D cross-sectional view of the semiconductor arrangement is illustrated as viewed from a perspective indicated by arrows on line 17-17 in FIG. 2, where the second dielectric layer 224 is removed. According to some embodiments, the one or more fins 204 with Epi caps 206 pass through the gate 208, such that on a first side 256 of the gate 208, the Epi caps 206b comprises one of a source or a drain and on a second side 258 of the gate 208, the Epi caps 206a comprises a source if the Epi caps 206b comprise a drain or a drain if the Epi caps 206b comprises a source. In some embodiments, the first metal connect 215 is formed around the one or more fins 204 with Epi caps 206b in the first active region 205. In some embodiments, the second metal connect 216 is formed around the one or fins 204 with Epi caps 206b in the second active region 207. In some embodiments, the STI region 209 comprises the STI 220, where the STI 220 is situated such that the STI 220 separates the one or more fins 204 with Epi caps 206 in the first active region 205 from the one or more fins 204 with Epi caps 206 in the second active region 207. In some embodiments, the third metal connect 218 connects the first metal connect 215 to the second metal connect 216, such that the one or more fins 204 with Epi caps 206b in the first active region 205 are connected to the one or more fins 204 with Epi caps 206b in the second active region 207. In some embodiments, the Epi caps 206b in the first active region 205 and the Epi caps 206b in the second active region 207 comprise drains, and thus the third metal connect 218 connects a first drain to a second drain. In some embodiments, the Epi caps 206b in the first active region 205 and the Epi caps 206b in the second active region 207 comprise sources, and thus the third metal connect 218 connects a first source to a second source.

According to some embodiments, a semiconductor arrangement comprises a first active region, a second active region, and a shallow trench isolation (STI) region between the first active region and the second active region. In some embodiments, a first metal connect is over the first active region and connected to the first active region, a second metal connect is over the second active region and connected to the second active region, and a third metal connect is over the first metal connect, the STI region and the second metal connect. In some embodiments, the third metal connect is connected to the first metal connect and to the second metal connect, such that the third metal connect connects the first metal connect to the second metal connect.

According to some embodiments, a method of forming a semiconductor arrangement comprises forming a first opening over a first active region, a shallow trench isolation (STI) region and a second active region, such that the first opening is over a first metal connect in the first active region, and is over a second metal connect in the second active region. In some embodiments, forming a semiconductor arrangement comprises forming a third metal connect in the first opening such that the third metal connect connects the first metal connect to the second metal connect.

According to some embodiments, a semiconductor arrangement comprises a first active region, a second active region, and a shallow trench isolation (STI) region between the first active region and the second active region. In some embodiments, a gate is over the first active region, the second active region and the STI region. In some embodiments, a first metal connect adjacent the gate is over the first active region and connected to the first active region, a second metal connect adjacent the gate is over the second active region and connected to the second active region, and a third metal connect is over the first metal connect, the STI region and the second metal connect. In some embodiments, the third metal connect is connected to the first metal connect and to the second metal connect such that the third metal connect connects the first metal connect to the second metal connect.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
    a first metal connect over a source/drain region of a first fin;
    a second metal connect over a source/drain region of a second fin, wherein the second metal connect is separated from the first metal connect by a first dielectric layer;
    a second dielectric layer over the first dielectric layer; and
    a third metal connect over the first metal connect, the second metal connect, and an isolation material separating the first fin from the second fin, wherein:
        the third metal connect is disposed in the second dielectric layer, and
        the third metal connect electrically couples the first metal connect to the second metal connect.

2. The semiconductor arrangement of claim 1, wherein the third metal connect electrically couples the source/drain region of the first fin to the source/drain region of the second fin by way of the first metal connect and the second metal connect.

3. The semiconductor arrangement of claim 1, comprising:
    a gate over the first fin, the second fin, and the isolation material separating the first fin from the second fin.

4. The semiconductor arrangement of claim 3, wherein the gate extends parallel to the third metal connect.

5. The semiconductor arrangement of claim 3, comprising:
    a metal contact over the gate and electrically coupled to the gate.

6. The semiconductor arrangement of claim 5, comprising:
    a dielectric layer over the gate, the first metal connect, and the second metal connect, wherein the third metal connect and the metal contact are disposed in the dielectric layer.

7. The semiconductor arrangement of claim 1, comprising:
    a gate extending parallel to the first metal connect and the second metal connect, wherein the gate is spaced apart from the first metal connect and the second metal connect by a dielectric layer.

8. The semiconductor arrangement of claim 1, wherein the third metal connect comprises:
a first metal layer; and
a second metal layer over the first metal layer, wherein a material composition of the first metal layer is different than a material composition of the second metal layer.

9. The semiconductor arrangement of claim 8, wherein the first metal layer is titanium and the second metal layer is titanium nitride.

10. The semiconductor arrangement of claim 8, wherein the third metal connect comprises:
a third metal layer over the second metal layer, wherein a material composition of the third metal layer is different than the material composition of the first metal layer and the material composition of the second metal layer.

11. A semiconductor arrangement, comprising:
a first metal connect disposed in a first dielectric layer, the first metal connect contacting a first set of at least two source/drain regions;
a second metal connect disposed in the first dielectric layer, the second metal connect contacting a second set of at least two source/drain regions;
a gate disposed in the first dielectric layer, the gate overlying a first set of at least two channel regions adjacent the first set of at least two source/drain regions and a second set of at least two channel regions adjacent the second set of at least two source/drain regions; and
a third metal connect over the first metal connect and the second metal connect, wherein the third metal connect electrically couples the first metal connect to the second metal connect.

12. The semiconductor arrangement of claim 11, comprising:
a second dielectric layer over the first metal connect, the second metal connect, the gate, and the first dielectric layer, wherein the third metal connect is disposed in the second dielectric layer.

13. The semiconductor arrangement of claim 12, comprising:
a metal contact disposed in the second dielectric layer, wherein the metal contact is in contact with the gate.

14. The semiconductor arrangement of claim 11, wherein the gate extends parallel to the third metal connect.

15. The semiconductor arrangement of claim 11, wherein the third metal connect comprises:
a first metal layer; and
a second metal layer over the first metal layer, wherein a material composition of the first metal layer is different than a material composition of the second metal layer.

16. A semiconductor arrangement, comprising:
a first set of fins;
a second set of fins, spaced apart from the first set of fins;
a first metal connect contacting the first set of fins;
a second metal connect contacting the second set of fins, wherein the second metal connect is separated from the first metal connect by a first dielectric layer;
a second dielectric layer over the first dielectric layer, the first metal connect, and the second metal connect; and
a third metal connect disposed in the second dielectric layer, wherein the third metal connect electrically couples the first metal connect to the second metal connect.

17. The semiconductor arrangement of claim 16, wherein the first set of fins comprises at least three fins.

18. The semiconductor arrangement of claim 16, wherein:
an epitaxial material is disposed over each fin of the first set of fins, and
the first metal connect is in contact with the first set of fins through the epitaxial material.

19. The semiconductor arrangement of claim 16, wherein a bottom surface of the third metal connect is over a top surface of the first dielectric layer.

20. The semiconductor arrangement of claim 16, comprising:
a gate contacting the first set of fins and the second set of fins, wherein a bottom surface of the third metal connect is over a top surface of the gate.

* * * * *